(12) United States Patent  
Wang et al.

(10) Patent No.: US 10,571,538 B2  
(45) Date of Patent: Feb. 25, 2020

(54) DIAGNOSTIC DEVICE AND METHOD FOR DIAGNOSING A FAULTY CONDITION IN A GRADIENT AMPLIFIER SYSTEM

(71) Applicant: General Electric Company, Schenectady, NY (US)

(72) Inventors: Ruxi Wang, Cohoes, NY (US); Juan Antonio Sabate, Wilton, NY (US)

(73) Assignee: General Electric Company, Schenectady, NY (US)

( * ) Notice: Subject to any disclaimer, the term of this patent is extended or adjusted under 35 U.S.C. 154(b) by 105 days.

(21) Appl. No.: 15/995,150

(22) Filed: Jun. 1, 2018

(65) Prior Publication Data

US 2019/0369183 A1 Dec. 5, 2019

(51) Int. Cl.
*G01R 33/385* (2006.01)
*G01R 31/06* (2006.01)
*G01R 33/36* (2006.01)

(52) U.S. Cl.
CPC ......... *G01R 33/3852* (2013.01); *G01R 31/06* (2013.01); *G01R 33/3628* (2013.01)

(58) Field of Classification Search
CPC ...... G01R 33/38; G01R 33/54; G01R 33/543; G01R 33/385; G01R 33/3852; G01R 33/36; G01R 33/3614; G01R 33/3628; G01R 31/06; G01R 17/105; G01R 27/26
See application file for complete search history.

(56) References Cited

U.S. PATENT DOCUMENTS 4,890,062 A 12/1989 Haragashira
5,066,914 A 11/1991 Vavrek et al.
6,307,378 B1 10/2001 Kozlowski
8,334,620 B2 12/2012 Park et al.
2016/0100791 A1 4/2016 Arad et al.
(Continued)

FOREIGN PATENT DOCUMENTS

CN 101926647 A 12/2010
WO 2016033342 A1 3/2016

OTHER PUBLICATIONS

Makiranta et al., "Novel Measurement Method for Magnetic Particles", 28th Annual International Conference of the IEEE Engineering in Medicine and Biology Society, http://ieeexplore.ieee.org/document/4462826/, Aug. 30-Sep. 3, 2006.

(Continued)

*Primary Examiner* — Son T Le

(57) ABSTRACT

A diagnostic device for diagnosing a faulty condition in a gradient amplifier system is presented. The diagnostic device includes a first current sensor configured to be coupled to an input terminal of a filter unit, where the first current sensor is configured to measure a first electric current at the input terminal of the filter unit, and where the first electric current includes a high frequency current component and a low frequency current component. Further, the diagnostic device includes a diagnostic unit coupled to the first current sensor and configured to determine an impedance across the filter unit and a load unit based on the low frequency current component of the measured first electric current and a pre-stored reference voltage, and diagnose the faulty condition of at least one component in at least one of the filter unit and the load unit based on a characteristic of the determined impedance.

20 Claims, 9 Drawing Sheets

(56) References Cited

U.S. PATENT DOCUMENTS

2017/0030846 A1  2/2017  Rapoport

OTHER PUBLICATIONS

Venclikova et al., "Automatic Driver Monitoring Using Electrical Impedance Measurement on Steering Wheel", Proceedings of the 8th International Conference on Signal Processing Systems(ICSPS), http://dl.acm.org/citation.cfm?id=3015185, pp. 178-182, Nov. 21-24, 2016.

DIAGNOSTIC DEVICE AND METHOD FOR DIAGNOSING A FAULTY CONDITION IN A GRADIENT AMPLIFIER SYSTEM

BACKGROUND

Embodiments of the present specification relate generally to magnetic resonance imaging (MRI) systems, and more particularly to a diagnostic device and a method for diagnosing a faulty condition in a gradient amplifier of a MRI system.

In just a few decades, the use of magnetic resonance imaging (MRI) scanners has grown tremendously. MRI scans are being increasingly used to aid in diagnosis of multiple sclerosis, brain tumors, torn ligaments, tendonitis, cancer, strokes, and the like. As will be appreciated, MRI is a noninvasive medical test that aids physicians in the diagnoses and treatment of various medical conditions. The enhanced contrast that an MRI scan provides between the different soft tissues of the body allows physicians to better evaluate various parts of the body and determine presence of certain diseases that may not be assessed adequately with other imaging methods such as X-ray, ultrasound, or computed tomography (CT).

Typically, a MRI system includes a gradient driver, an output filter, and gradient coils. Further, the gradient driver is configured to excite the gradient coils located around an object, for example a patient, to generate gradient magnetic fields along one or more directions. To generate adequate gradient magnetic fields within a short period of time, the gradient driver is designed to drive a high current and a high voltage to the gradient coils through the output filter. The high current may be around 1000 A and the high voltage may be around 2000V, for example. Also, it is desirable to operate the gradient driver at a high switching frequency to reduce size of the output filter coupled to the gradient coil. However, operating the gradient driver at a high switching frequency with high current and high voltage may impose thermal stress on the gradient coil and the output filter. As a result, the gradient coil and/or components in the output filter may be adversely impacted.

In a conventional MRI system, the gradient drivers/amplifiers are turned OFF and electrical connections are disconnected to diagnose failed or damaged components in the system. Also, an external device, such as an analyzer is required to characterize a parameter of the system to diagnose a faulty component in the system. However, using the analyzer to diagnose the faulty component is a complicated technique and may not be accurate as the fault detection is preformed offline or when the system is turned OFF.

BRIEF DESCRIPTION

Briefly in accordance with one aspect of the present specification, a diagnostic device for diagnosing a faulty condition in a gradient amplifier system is presented. The diagnostic device includes a first current sensor configured to be electrically coupled to an input terminal of a filter unit of the gradient amplifier system, where the first current sensor is configured to measure a first electric current at the input terminal of the filter unit, and where the first electric current includes a high frequency current component and a low frequency current component. Further, the diagnostic device includes a diagnostic unit electrically coupled to the first current sensor, where the diagnostic unit is configured to determine an impedance across the filter unit and a load unit based on the low frequency current component of the measured first electric current and a pre-stored reference voltage, and diagnose the faulty condition of at least one component in at least one of the filter unit and the load unit based on a characteristic of the determined impedance.

In accordance with another aspect of the present specification, a gradient amplifier system is presented. The gradient amplifier system includes a gradient driver unit configured to generate a coil current signal. Further, the gradient amplifier system includes a filter unit electrically coupled to the gradient driver unit and configured to filter ripples in the coil current signal to generate a filtered coil current signal. Also, the gradient amplifier system includes a load unit electrically coupled to the filter unit and configured to receive the filtered coil current signal and generate a gradient magnetic field. Furthermore, the gradient amplifier system includes a diagnostic device including a first current sensor electrically coupled to an input terminal of the filter unit, where the first current sensor is configured to measure a first electric current at the input terminal of the filter unit, and where the first electric current includes a high frequency current component and a low frequency current component. In addition, the diagnostic device includes a diagnostic unit electrically coupled to the first current sensor, where the diagnostic unit is configured to determine an impedance across the filter unit and the load unit based on the low frequency current component of the measured first electric current and a pre-stored reference voltage, and diagnose a faulty condition of at least one component in at least one of the filter unit and the load unit based on a characteristic of the determined impedance.

In accordance with yet another aspect of the present specification, a magnetic resonance imaging system is presented. The magnetic resonance imaging system includes scanner control circuitry configured to acquire image data, where the scanner control circuitry includes a gradient amplifier system. Further, the gradient amplifier system includes a gradient driver unit configured to generate a coil current signal. Also, the gradient amplifier system includes a filter unit electrically coupled to the gradient driver unit and configured to filter ripples in the coil current signal to generate a filtered coil current signal. In addition, the gradient amplifier system includes a load unit electrically coupled to the filter unit and configured to generate a gradient magnetic field based on the filtered coil current signal. Furthermore, the gradient amplifier system includes a diagnostic device including a first current sensor electrically coupled to an input terminal of the filter unit, where the first current sensor is configured to measure a first electric current at the input terminal of the filter unit, and where the first electric current includes a high frequency current component and a low frequency current component. Also, the diagnostic device includes a diagnostic unit electrically coupled to the first current sensor, where the diagnostic unit is configured to determine an impedance across the filter unit and the load unit based on the low frequency current component of the measured first electric current and a pre-stored reference voltage and diagnose a faulty condition of at least one component in at least one of the filter unit and the load unit based on a characteristic of the determined impedance. In addition, the magnetic resonance imaging system includes system control circuitry communicatively coupled to the scanner control circuitry and configured to process the acquired image data.

DRAWINGS

These and other features, aspects, and advantages of the present invention will become better understood when the following detailed description is read with reference to the accompanying drawings in which like characters represent like parts throughout the drawings, wherein.

Figure 1:
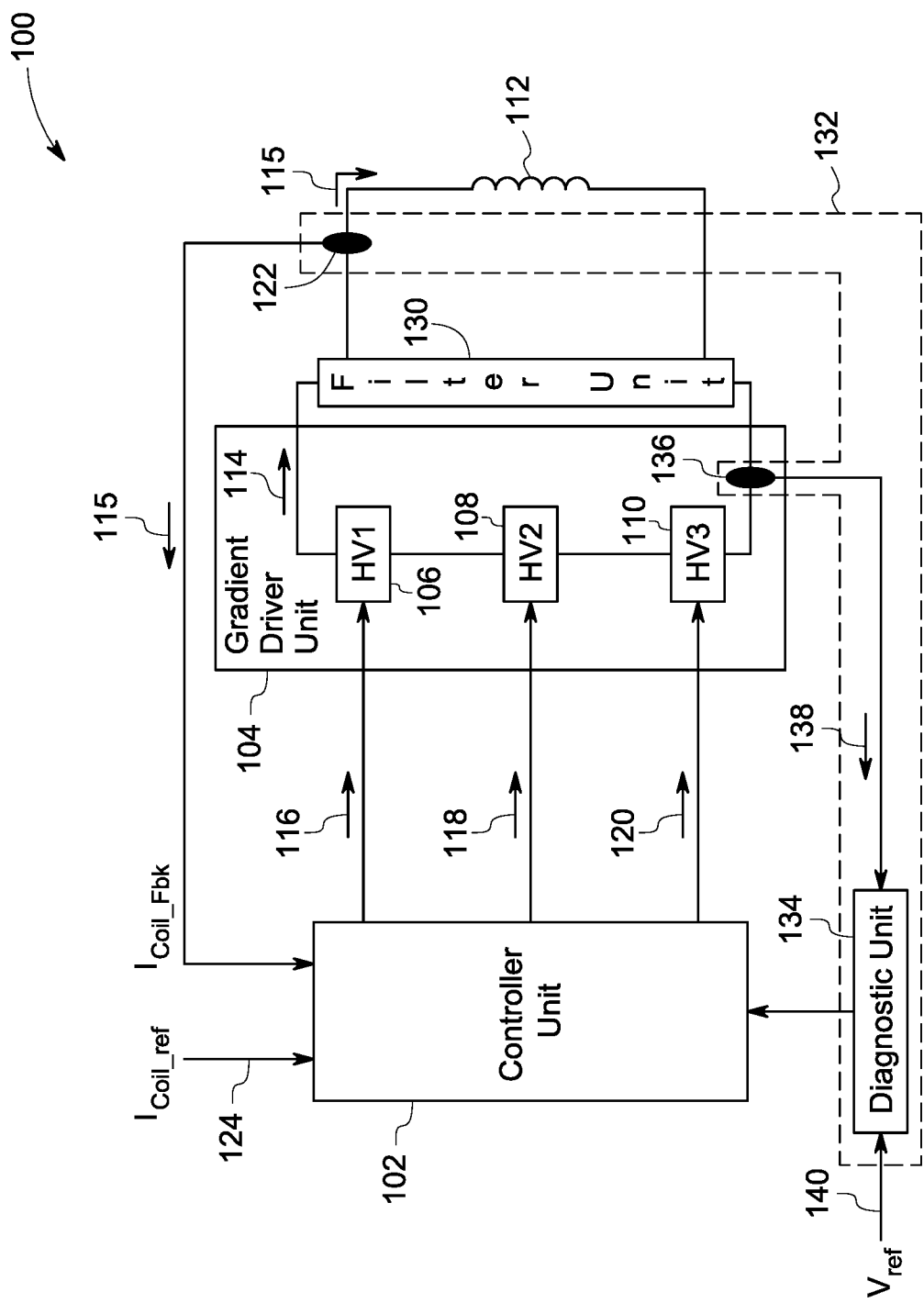
FIG. 1 is a block diagram of a gradient amplifier system, in accordance with aspects of the present specification.
Figure 2:
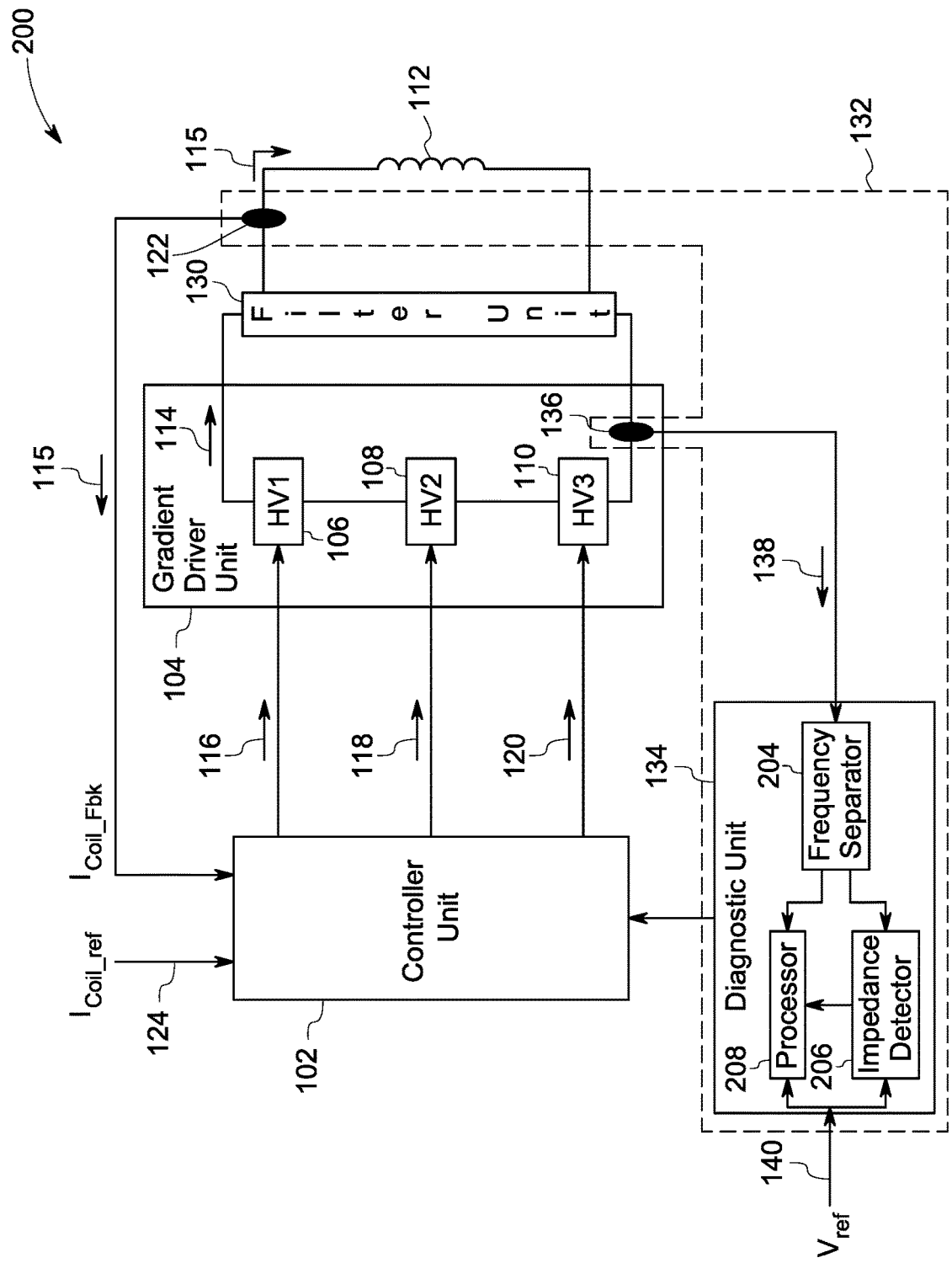
FIG. 2 is a block diagram of the gradient amplifier system of FIG. 1 illustrating one embodiment of an exemplary diagnostic unit, in accordance with aspects of the present specification.
Figure 8:
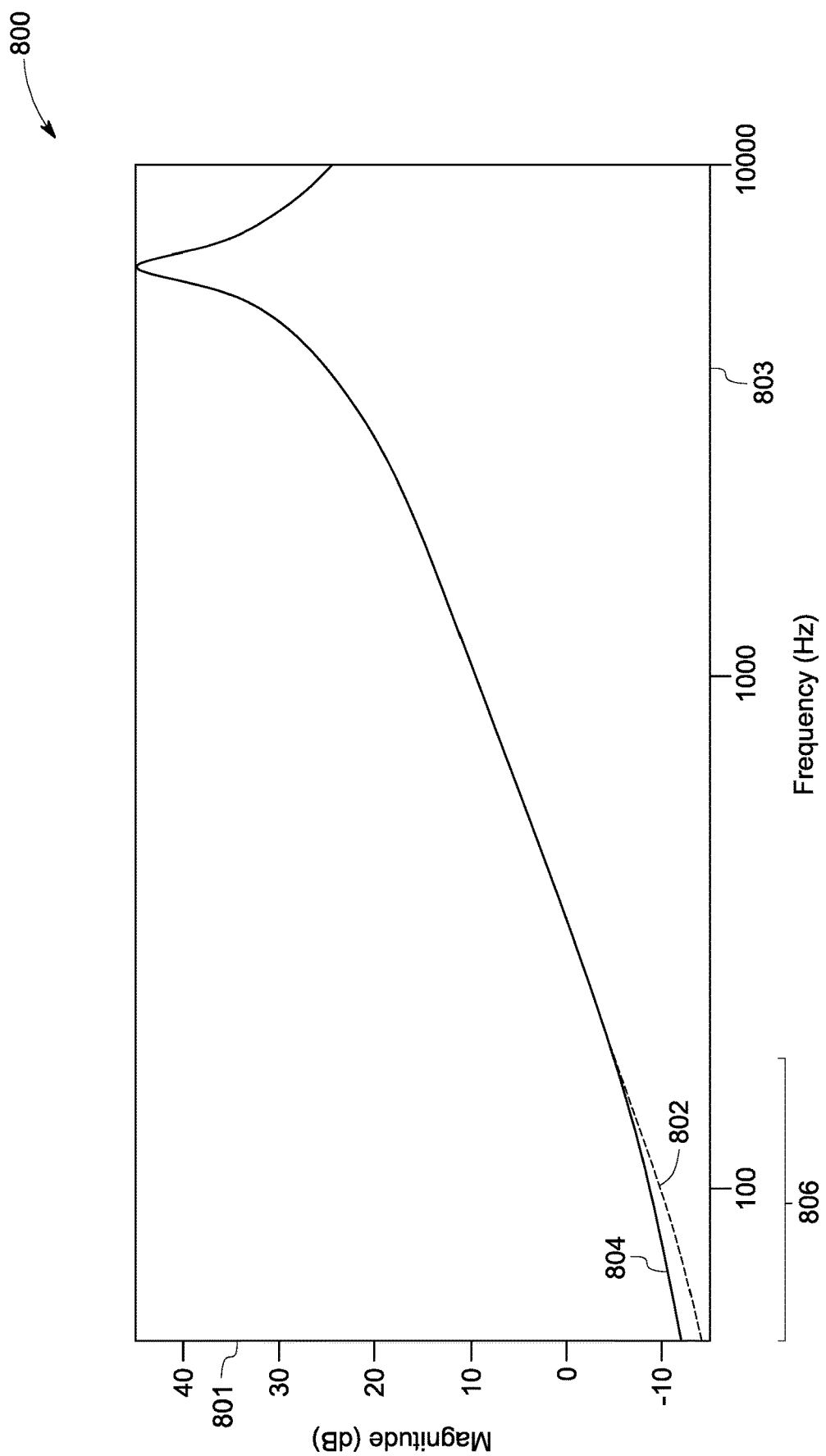
Figure 9:
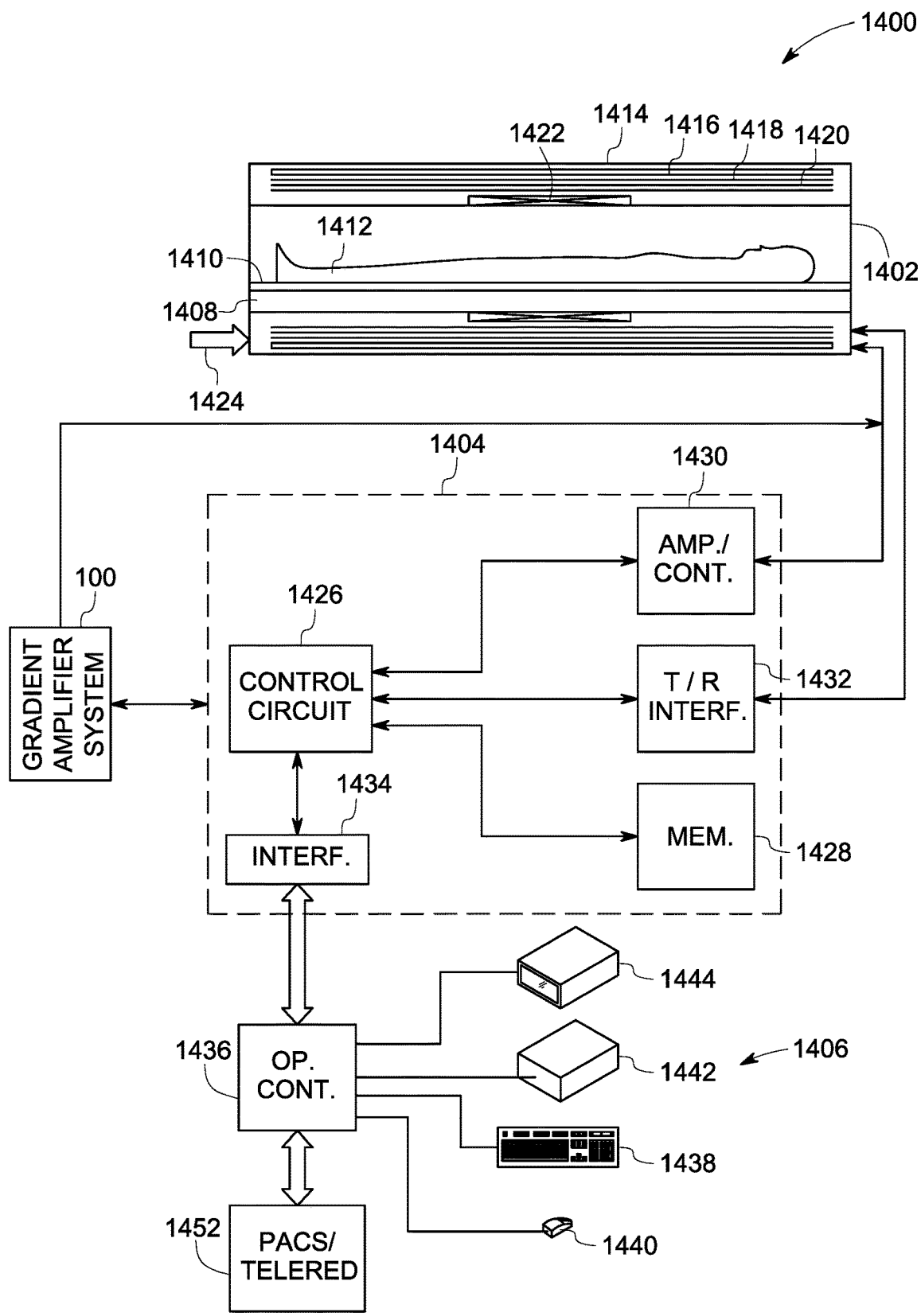

FIG. 8 is a graphical representation of a comparison of a determined impedance and a second predefined impedance across a second sub-range of frequencies determined using the gradient amplifier system of FIG. 2, in accordance with aspects of the present specification; and FIG. 9 is a block diagram illustrating a magnetic resonance imaging (MRI) system having the gradient amplifier system of FIG. 1, in accordance with aspects of the present specification.

DETAILED DESCRIPTION

As will be described in detail hereinafter, various embodiments of an exemplary device and method for diagnosing a faulty condition in a gradient amplifier system are disclosed. Parameters of the gradient amplifier system are monitored during operation of the gradient amplifier system and online diagnosis of the faulty condition in the gradient amplifier system is performed based on the monitored parameters.

Turning now to the drawings, and referring to FIG. 1, a block diagram of an exemplary gradient amplifier system 100 for use in an MRI system, for example, in accordance with aspects of the present specification, is depicted. The gradient amplifier system 100 includes a controller unit 102, a gradient driver unit 104, a filter unit 130, a load unit 112, and a diagnostic device 132. The functioning of each component will be described in greater detail with reference to FIGS. 2-4.

As used herein, the term "gradient driver unit" refers to a power amplifier for generating an electric current that in one example has a value in a range from about −1200 A to about +1200 A and a voltage having a value in a range from about −2500V to about +2500V to drive the load unit 112 at a desired range. Similarly, the term "controller unit" refers to a controller/processor that is configured to control or regulate an amplitude and a frequency of a voltage signal provided to the load unit 112. In one example, the controller unit 102 may include one or more of an arithmetic logic unit, a microprocessor, a general-purpose controller, and a processor array to perform desired computations/functions. While the controller unit 102 is shown as a single unit, in certain embodiments, the controller unit may include more than one processor co-located or distributed in different locations. In one embodiment, a non-transitory computer readable medium may be encoded with a program having a sequence of instructions to instruct the controller unit 102 to perform desired computations/functions. Further, the term "load unit" refers to one or more gradient coils that are configured to generate a gradient magnetic field. Also, it may be noted that the terms "load unit" and "gradient coil" may be used interchangeably.

As will be appreciated, an MRI system typically includes one or more gradient coils 112, where each gradient coil 112 is driven by a corresponding gradient driver unit 104. For ease of illustration, in the illustrated embodiment, only one gradient coil 112 and one gradient driver unit 104 are illustrated. The gradient coil 112 is typically used to alter a primary magnetic field of the MRI system by creating gradient fields at frequencies such as up to several kilohertz to facilitate fast imaging. A typical inductance of the gradient coil 112, in one embodiment, may be in a range from about hundreds of µH to about 1 mH. Also, a typical voltage in the gradient coil 112, in one embodiment, may be in a range from about 1000 volts to about 2000 volts, while the current in the gradient coil 112 may be in a range from about 0 amperes to about 500 amperes. While the embodiments described hereinafter refer to MRI system applications, use of the techniques described herein in other applications that entail use of high voltage and high current at very high fidelity are also envisaged.

In the illustrated embodiment, the gradient coil 112 is coupled to an output terminal of the gradient driver unit 104. The gradient coil 112 is configured to produce a magnetic field proportional to a coil current signal 114 generated by the gradient driver unit 104. The coil current signal 114 is used for exciting the gradient coil 112. As used herein, the term "coil current signal" refers to a signal representative of electric current that is supplied by the gradient driver unit 104 to the gradient coil 112 to induce a desired magnetic field across the gradient coil 112. In the embodiment of FIG. 1, the filter unit 130 is coupled to the gradient driver unit 104 and the gradient coil 112. Particularly, the filter unit 130 is coupled to the output terminal of the gradient driver unit 104 and configured to filter ripple current associated with the coil current signal 114. After filtering the ripple current, the filter unit 130 provides a filtered coil current signal 115 to the gradient coil 112.

The gradient driver unit 104 shown in FIG. 1 includes a first bridge amplifier 106, a second bridge amplifier 108, and a third bridge amplifier 110 coupled in series to each other. Although the present embodiment of the gradient driver unit 104 is described with reference to the three bridge amplifiers 106, 108, 110, it may be noted that the number of bridge amplifiers in the gradient driver unit 104 may vary depending on the application.

Furthermore, the controller unit 102 is coupled to the gradient driver unit 104 and configured to generate control signals to control the operation of the gradient driver unit 104. Particularly, the controller unit 102 transmits pulse width modulated gate signals 116, 118, 120 to the gradient driver unit 104 for controlling an operating frequency of each of the bridge amplifiers 106, 108, 110. As used herein, the term "operating frequency" refers to a frequency that is employed for switching the bridge amplifiers 106, 108, 110 between ON and OFF conditions. Voltage at the output terminal of the gradient driver unit 104 is controlled by appropriately switching the bridge amplifiers 106, 108, 110 between corresponding ON and OFF states. In one example, the ON state may include a −Vdc state or a +Vdc state and the OFF state may include a 0V state.

In the embodiment illustrated in FIG. 1, the controller unit 102 receives a reference current signal ($I_{coil\_ref}$) 124 from an external source such as a host computer and the filtered coil current signal 115 from the filter unit 130. The controller unit 102 generates the pulse width modulated gate signals based on the reference current signal ($I_{coil\_ref}$) 124 and the filtered coil current signal 115. In one embodiment, the pulse width modulated gate signals are generated based on a slew rate and an amplitude of the reference current signal 124 and an amplitude of the filtered coil current signal 115. The term "slew rate" refers to a rate at which an amplitude of the reference current signal 124 is varied with respect to time. The gradient magnetic field generated across the gradient coil 112 is controlled based on the generated pulse width modulated gate signals.

Additionally, the filtered coil current signal 115 is provided as a feedback current signal ($I_{coil\_Fbk}$) from an input terminal of the gradient coil 112 to the controller unit 102. Specifically, the feedback current signal (filtered coil current signal) 115 is employed by the controller unit 102 to compensate for any deviation of the electric current delivered to the gradient coil 112 with respect to the reference current signal ($I_{coil\_ref}$) 124.

Specifically, the controller unit 102 generates the pulse width modulated gate signals based on the feedback current signal ($I_{coil\_Fbk}$) and the reference current signal 124 ($I_{coil\_ref}$). Thereafter, the controller unit 102 transmits the generated pulse width modulated gate signals 116, 118, 120 to corresponding bridge amplifiers 106, 108, 110. The pulse width modulated gate signals are used to control the operating frequencies of the bridge amplifiers 106, 108, 110, thereby enabling reduction in switching losses of the bridge amplifiers 106, 108, 110. The aspects of controlling the operating frequencies of the bridge amplifiers 106, 108, 110 are described in greater detail with reference to FIG. 3. It may be noted that the terms "operating frequency" and "switching frequency" may be used interchangeably.

In some instances, the gradient driver unit 104 is required to drive high current and high voltage to the gradient coil 112 via the filter unit 130 to generate an appropriate/a suitable gradient magnetic field within a short period of time. In one example, the high current may be around 1000 A and the high voltage may be around 2000V. Also, the gradient driver unit 104 may be operated at a high switching frequency so that the size of the filter unit 130 can be reduced. In one example, the high switching frequency may be around 31.25 kHz. However, operating the gradient driver unit 104 at a high switching frequency, high voltage, and high current may impose thermal stress on the gradient coil 112 and the filter unit 130. As a result, the gradient coil 112 and/or components in the filter unit 130 may fail or be partially damaged over time. It may be noted that a condition of the gradient amplifier system 100 that indicates the failure of one or more components in the filter unit 130 and/or the damaged gradient coil 112 is referred to as a "faulty condition." In one example, failure of a capacitor in the filter unit 130 may be referred as the faulty condition of the filter unit 130.

The exemplary gradient amplifier system 100 includes the diagnostic device 132 to detect such a faulty condition. In particular, the diagnostic device 132 is operatively coupled to the gradient driver unit 104 and the controller unit 102.

Further, the diagnostic device 132 is configured to diagnose the faulty condition based on an electric current measured at the input terminal of the filter unit 130 and a reference voltage 140 received from an external source, such as the host computer (not shown in FIG. 1). In one embodiment, the diagnostic device 132 may monitor the gradient amplifier system 100 during operation to diagnose the faulty condition. Monitoring the gradient amplifier system 100 during operation is useful because the diagnostic device 132 may diagnose the faulty condition even when the gradient driver unit 104 is actively functioning to drive the gradient coil 112 to generate the gradient magnetic field.

In the embodiment shown in FIG. 1, the diagnostic device 132 includes a diagnostic unit 134, a first current sensor 136, and a second current sensor 122. The diagnostic unit 134 is electrically coupled to the first current sensor 136 and the controller unit 102. Further, the second current sensor 122 is electrically coupled to the controller unit 102. The first current sensor 136 is electrically coupled to the input terminal of the filter unit 130 and is configured to measure a first electric current at the input terminal of the filter unit 130. In one example, the first electric current may be in a range from about 0 A to about 1000 A. The first electric current includes a high frequency current component and a low frequency current component. In one example, a frequency value of the low frequency current component may be less than or equal to 10 kHz and a frequency value of the high frequency current component may be greater than 10 kHz. In a similar manner, the second current sensor 122 is electrically coupled to the input terminal of the load unit 112 and configured to determine/measure a second electric current at the input terminal of the load unit 112. Further, the diagnostic unit 134 is operatively coupled to the first current sensor 136 and configured to receive a first current signal 138 corresponding to the measured first electric current from the first current sensor 136. Also, the diagnostic unit 134 determines an impedance across the filter unit 130 and the load unit 112 based on the low frequency current component of the measured first electric current and a pre-stored reference voltage. In one embodiment, the pre-stored reference voltage may be the reference voltage 140 received from the external source and stored within the diagnostic unit 134. The details pertaining to determination of the impedance will be described with reference to FIG. 2.

The diagnostic unit 134 may then diagnose the faulty condition of at least one component in the filter unit 130 and/or the load unit 112 based on a characteristic of the determined impedance. In one example, the characteristic of the determined impedance may be a magnitude of the impedance. More specifically, the diagnostic unit 134 compares the characteristic of the determined impedance with a predefined impedance characteristic to estimate a change in the impedance across the filter unit 130 and the load unit 112. It may be noted that the predefined impedance characteristic may be representative of a characteristic of the impedance across the filter unit 130 and the load unit 112 in the absence of a damaged component in the filter unit 130 and/or the load unit 112.

Subsequent to the comparison of the characteristic of the determined impedance with the predefined impedance characteristic, the diagnostic unit 134 diagnoses the faulty condition based on the change in the impedance. In one embodiment, the diagnostic unit 134 diagnoses the faulty condition if the change in the impedance is greater than a reference impedance value. Furthermore, in one embodiment, the diagnostic unit 134 may determine a difference between a magnitude of the determined impedance and the magnitude of a predefined impedance to determine the change in the impedance across the filter unit 130 and the load unit 112. Further, if the difference between the magnitude of the determined impedance and the magnitude of the predefined impedance is greater than the reference impedance value, the diagnostic unit 134 detects the faulty condition in the gradient amplifier system 100. In one non-limiting example, the diagnostic unit 134 detects the faulty condition in the gradient amplifier system 100 if the magnitude of the determined impedance is about 5% greater than the magnitude of the predefined impedance. The aspect of determining the faulty condition in the gradient amplifier system 100 is described in greater detail with reference to FIG. 2.

Upon diagnosing the faulty condition, the diagnostic unit 134 may communicate the faulty condition to an operator of the MRI system to replace or rectify the faulty components in the filter unit 130 and/or the load unit 112. In one embodiment, the diagnostic unit 134 may transmit a fault indicator signal indicating the faulty condition to the controller unit 102. Further, the controller unit 102 may change the switching frequency of the gradient driver unit 104 to reduce thermal stress on the filter unit 130 and the load unit/gradient coils 112. Also, the change in the switching frequency may reduce power loss in the system 100.

Thus, by employing the exemplary gradient amplifier system 100, parameters of the filter unit 130 and the load unit 112 are monitored online and the faulty condition is diagnosed without deactivating the gradient amplifier system 100.

Referring to FIG. 2, a block diagram 200 of the gradient amplifier system 100 of FIG. 1 illustrating one embodiment of the exemplary diagnostic unit 134, in accordance with aspects of the present specification, is depicted. More particularly, in FIG. 2 various components of the diagnostic unit 134 are depicted. FIG. 2 is described with reference to the components of FIG. 1.

The diagnostic unit 134 includes a frequency separator 204, an impedance detector 206, and a processor 208. The frequency separator 204 is coupled to the impedance detector 206 and the processor 208. Further, the impedance detector 206 is coupled to the processor 208. Also, the impedance detector 206 is configured to receive the reference voltage 140 from the external source. In one embodiment, the impedance detector 206 may store the reference voltage 140 as a pre-stored reference voltage.

Further, the frequency separator 204 is operatively coupled to the first current sensor 136 of the gradient driver unit 104. The frequency separator 204 is configured to receive the first current signal 138 corresponding to the first electric current measured at the input terminal of the filter unit 130. The first current signal 138 includes a high frequency current component and a low frequency current component of the first electric current.

Upon receiving the first current signal 138, the frequency separator 204 performs a Fast Fourier Transform (FFT) operation to extract the low frequency current component from the received first current signal 138. More specifically, the first current signal 138 is processed in a frequency domain and the FFT operation is performed to separate the low frequency current component from the high frequency current component of the first electric current. It may be noted that the low frequency current component may be across a range of frequencies. In one example, the range of frequencies may be from about 40 Hz to 20 kHz. Further, the frequency separator 204 communicates the separated low frequency current component of the first electric current to the impedance detector 206 and the processor 208.

The impedance detector 206 receives the reference voltage ($V_{ref}$) 140 from the external source and receives the low frequent component of the first electric current from the frequency separator 204. In one embodiment, the reference voltage 140 may be stored as the pre-stored reference voltage within the impedance detector 206. Further, the impedance detector 206 is configured to determine the impedance across the filter unit 130 and the load unit 112 based on a ratio of the reference voltage 140 to the low frequency current component of the first electric current. More specifically, the impedance detector 206 may determine the impedance across the range of frequencies associated with the low frequency current component to estimate a characteristic of the impedance. In one example, the characteristic of the impedance may include a magnitude of the impedance. Thereafter, the impedance detector 206 transmits the determined impedance corresponding to the range of frequencies to the processor 208.

Figure 6:
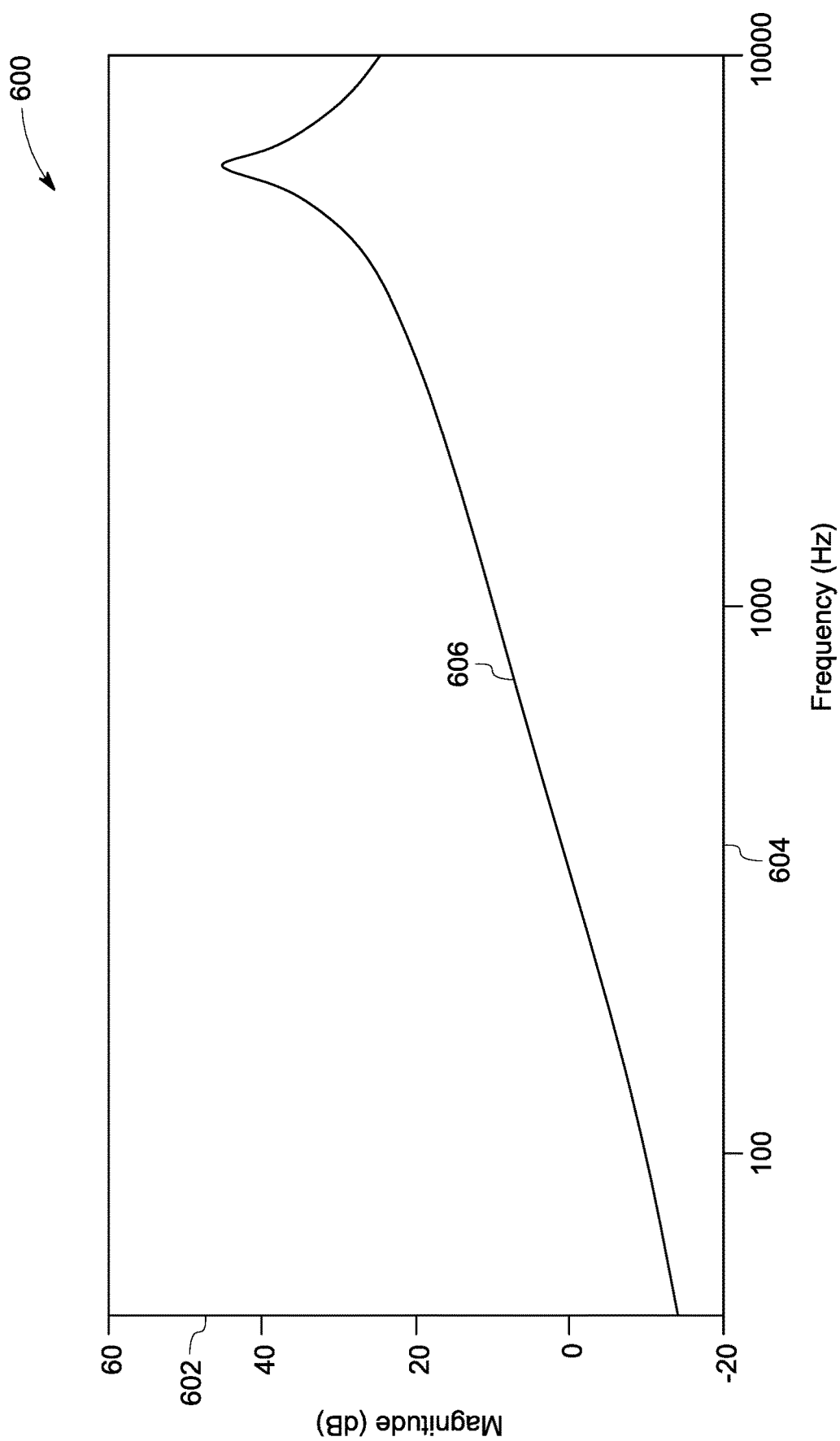
FIG. 6 is a graphical representation of different impedance values across a range of frequencies associated with a low frequency current component in the gradient amplifier system of FIG. 2, in accordance with aspects of the present specification.

FIG. 6 is a graphical representation 600 of different impedance values across the range of frequencies associated with the low frequency current component, in accordance with the embodiment of FIG. 2. Y-axis 602 is representative of a magnitude of the impedance and X-axis 604 is representative of a range of frequencies of the low frequency current component. A curve 606 is representative of variation of the different impedance values across the range of frequencies associated with the low frequency current component. In accordance with the illustrated embodiment, the curve 606 is representative of impedance values determined when the filter unit 130 and the gradient coils 112 have no faulty components. These impedance values are used as reference impedance values, such as a first predefined impedance and a second predefined impedance for determining the faulty condition.

Referring again to FIG. 2, the processor 208 receives the low frequency current component of the first electric current from the frequency separator 204 and the determined impedance from the impedance detector 206. Further, the processor 208 compares impedance values across a first sub-range of frequencies of the range of frequencies with the first predefined impedance corresponding to the first sub-range of frequencies. In one example, the first sub-range of frequencies may be in a range from about 1 kHz to 10 kHz. The processor 208 includes a memory (not shown) that has prestored values of the first predefined impedance corresponding to the first sub-range of frequencies. Further, the processor 208 compares each impedance value determined by the impedance detector 206 across the first sub-range of frequencies with a corresponding value of the prestored values associated with the first predefined impedance. In one example, the impedance values across the first sub-range of frequencies may be referred to as a first impedance.

Furthermore, if the difference between the determined first impedance and the first predefined impedance across the first sub-range of frequencies is greater than a first predetermined value, the processor 208 diagnoses a faulty condition of at least one component in the filter unit 130 and/or the load unit 112. In one example, if the determined first impedance is 5% greater than the first predefined impedance across the first sub-range of frequencies, the processor 208 confirms the faulty condition in the filter unit 130 and/or the load unit 112.

Figure 7:
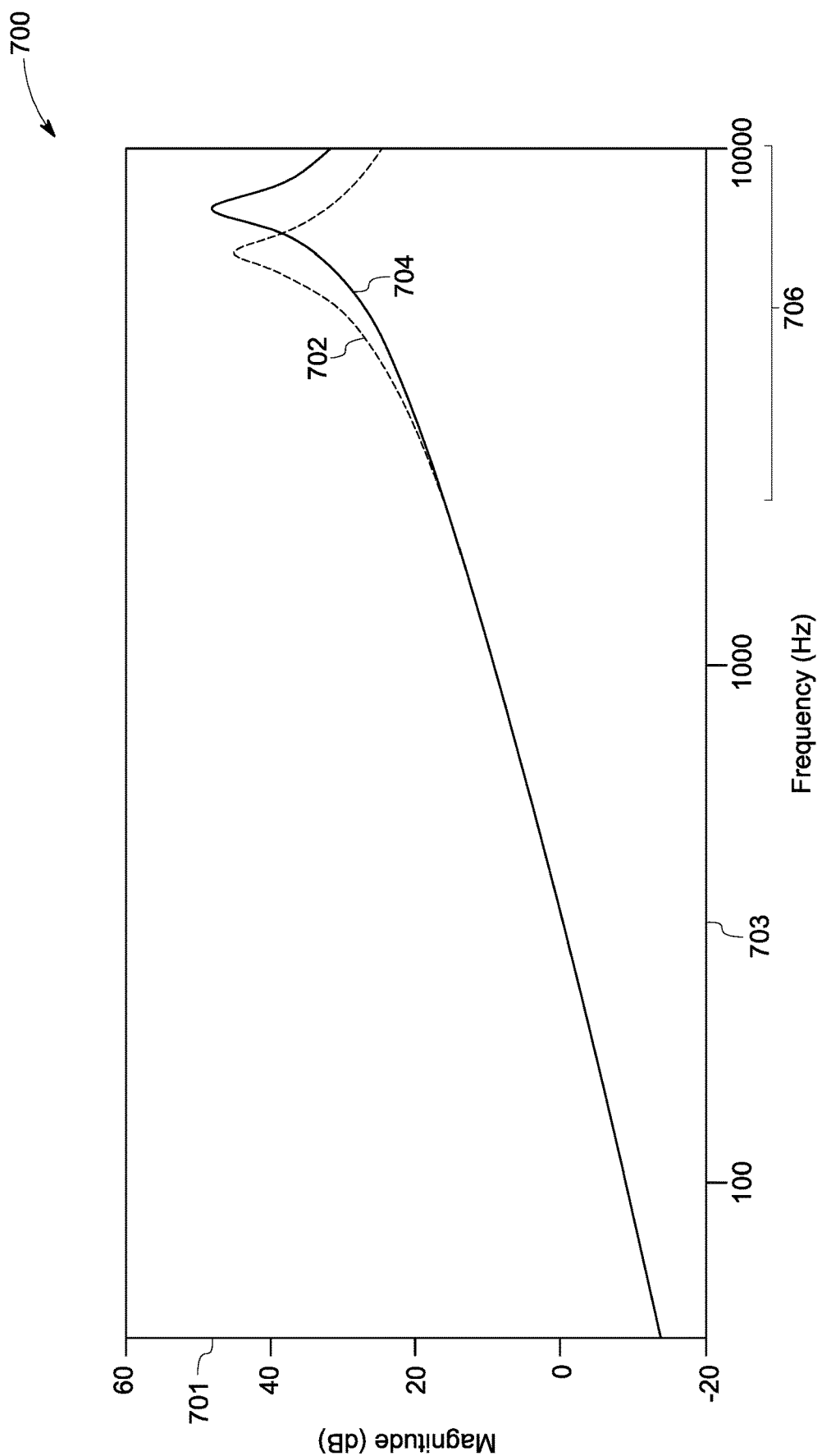
FIG. 7 is a graphical representation of a comparison of a determined impedance and a first predefined impedance across a first sub-range of frequencies determined using the gradient amplifier system of FIG. 2, in accordance with aspects of the present specification.

FIG. 7 is a graphical representation 700 of a comparison of the determined first impedance and the first predefined impedance across the first sub-range of frequencies, in accordance with the embodiment of FIG. 2. Y-axis 701 is representative of a magnitude of the impedance and X-axis 703 is representative of a range of frequencies of the low frequency current component. A curve 702 represents variation of magnitude values of the determined impedance across the range of frequencies of the low frequency current component and the reference numeral 704 represents variation of magnitude values of the first predefined impedance across the range of frequencies of the low frequency current component. Also, the reference numeral 706 is indicative of the first sub-range of frequencies of the range of the frequencies. It is evident from the curves 702, 704 that the determined first impedance is different from the first predefined impedance at the first sub-range of frequencies 706. The change in the impedance between the determined first impedance and the first predefined impedance is due to one or more faulty components in the filter unit 130 and the load unit 112. By way of example, the change in the impedance across the first sub-range of frequencies 706 may be mainly due to one or more faulty components in the filter unit 130. In one example, the failed components may include one or more capacitors or other passive components in the filter unit 130.

With returning reference to FIG. 2, the processor 208 also compares the impedance determined by the impedance detector 206 across a second sub-range of frequencies of the range of frequencies with a second predefined impedance corresponding to the second sub-range of frequencies. In one example the second sub-range of frequencies may be in a range from about 40 Hz to about 900 Hz. The memory includes prestored values of the second predefined impedance corresponding to the second sub-range of frequencies. Further, the processor 208 compares each impedance value determined by the impedance detector 206 across the second sub-range of frequencies with a corresponding value of the prestored values associated with the second predefined impedance. In one example, the impedance value across the second sub-range of frequencies may be referred to as a second impedance.

Furthermore, if the difference between the determined second impedance and the second predefined impedance across the second sub-range of frequencies is greater than a second predetermined value, the processor 208 diagnoses the faulty condition of the at least one component in the filter unit 130 and/or the load unit 112. In one example, if the value of the determined second impedance is 5% lower than the second predefined impedance across the second sub-range of frequencies, the processor 208 confirms the faulty condition in the filter unit 130 and/or the load unit 112.

FIG. 8 is a graphical representation 800 of a comparison of the determined second impedance and the second predefined impedance across a second sub-range of frequencies, in accordance with the embodiment of FIG. 2. Magnitude of the impedance is represented by Y-axis 801 and a range of frequencies of the low frequency current component is represented by X-axis 803. Curve 802 represents magnitude values of the determined second impedance and curve 804 represents magnitude values of the second predefined impedance. Also, reference numeral 806 represents the second sub-range of frequencies of the range of the frequencies. It is evident that from the curves 802, 804 that the determined second impedance is different from the second predefined impedance at the second sub-range of frequencies 806. The change in the impedance between the determined second impedance and the second predefined impedance is due to damage/failure of the gradient coils or the load unit 112 and one or more faulty components in the filter unit 130. By way of a non-limiting example, the change in the impedance across the second sub-range of frequencies 806 may be due to damage/failure of the gradient coils or the load unit 112.

Referring again to FIG. 2, upon diagnosing the faulty condition, the diagnostic unit 134 indicates to the operator that one or more components in the filter unit 130 and/or the load unit 112 are damaged or have failed. Also, the diagnostic unit 134 may indicate to the operator to replace or repair the failed or damaged components. In another embodiment, the diagnostic unit 134 may transmit a fault indicator signal indicating the faulty condition to the controller unit 102. Further, the controller unit 102 may change the switching frequency or operating frequency of the gradient driver unit 104 to reduce thermal stress on the filter unit 130 and the gradient coil 112. The aspect of controlling the switching frequency of the gradient driver unit 104 is described in greater detail with reference to FIG. 3.

Figure 3:
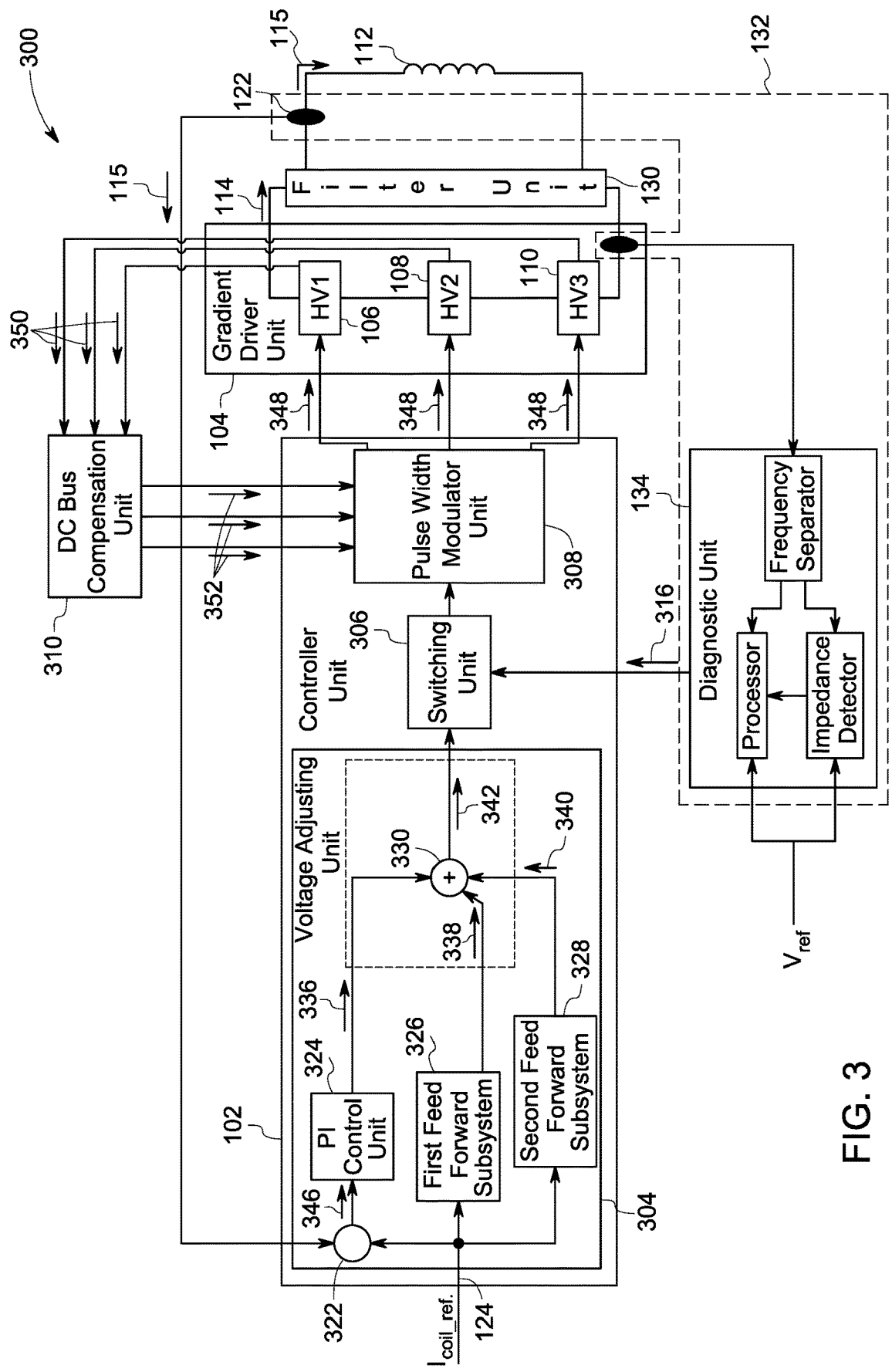
FIG. 3 is a diagrammatical illustration of the gradient amplifier system of FIG. 2 illustrating one embodiment of a controller unit, in accordance with aspects of the present specification.

Turning to FIG. 3, a block diagram 300 of the gradient amplifier system 100 of FIG. 1 illustrating one embodiment of the exemplary controller unit 102, in accordance with aspects of the present specification, is depicted. More particularly, in FIG. 3 various components of the controller unit 102 are depicted. FIG. 3 is described with reference to the components of FIGS. 1-2.

The controller unit 102 includes a voltage adjusting unit 304, a switching unit 306, and a pulse width modulator (PWM) unit 308. The voltage adjusting unit 304 is operatively coupled to the switching unit 306. Further, the switching unit 306 is operatively coupled to the PWM unit 308 and the diagnostic unit 134. Also, the PWM unit 308 is operatively coupled to a DC bus compensation unit 310. In one embodiment, the switching unit 306 may include one or more electronic switching modules to electrically couple the voltage adjusting unit 304 or the diagnostic unit 134 to the PWM unit 308. In particular, if a faulty condition of filter unit 130 and/or the load unit 112 is diagnosed, the switching unit 306 couples the diagnostic unit 134 to the PWM unit 308. However, if no faulty condition of the filter unit 130 and/or the load unit 112 is diagnosed, the switching unit 306 couples the voltage adjusting unit 304 to the PWM unit 308.

Also, the second current sensor 122 is coupled to the input terminal of the load unit 112 and configured to determine/measure a second electric current at the input terminal of the load unit 112. The second current sensor 122 is operatively coupled to the voltage adjusting unit 304. Further, the second current sensor transmits the second current signal representative of the second electric current to the voltage adjusting unit 304. It may be noted that the second current signal may be referred to as the feedback current signal ($I_{coil\_Fbk}$) or the filtered coil current signal 115 shown in FIG. 1.

In the embodiment depicted in FIG. 3, the voltage adjusting unit 304 includes an error calculation node 322, a PI control unit 324, a first feed forward subsystem 326, a second feed forward subsystem 328, and a summing unit 330. Moreover, the error calculation node 322 is coupled to an input terminal of the proportional integral (PI) control unit 324. Also, the error calculation node 322 is operatively coupled to the second current sensor 122 to receive the second current signal 115 from the second current sensor 122. Further, the error calculation node 322 identifies an error current signal 346 by subtracting the second current signal 115 from the reference current signal 124. The error current signal 346 is indicative of a deviation of the second current signal 115 from the reference current signal 124. It is desirable to reduce the deviation of the second current signal 115 from the reference current signal 124 and maintain a stable operation of the gradient amplifier system 100. The error current signal 346 is provided to an input terminal of the PI control unit 324. Furthermore, the PI control unit 324 generates a PI voltage 336 corresponding to the error current signal 346. In addition, the PI control unit 324 may also aid in progressively minimizing the error current signal 346, thereby enhancing the transient response of the gradient amplifier system 100.

Moreover, the first feed forward subsystem 326 determines an inductance voltage drop 338 across the gradient coil 112 and the filter unit 130. The voltage adjusting unit 304 may also include a second feed forward subsystem 328. The second feed forward subsystem 328 determines a resistive voltage drop 340 across the gradient coil 112 and the filter unit 130. In one embodiment, the combination of the first feed forward subsystem 326 and the second feed forward subsystem 328 may be represented as a coil model unit.

Additionally, in one embodiment, the voltage adjusting unit 304 includes a summing unit 330 that sums the PI voltage 336, the inductive voltage 338, and the resistive voltage 340 received at an input terminal, and provides a voltage command signal ($V_{cmd}$) 342 at an output terminal of the summing unit 330. Further, the voltage command signal ($V_{cmd}$) 342 is provided to the PWM unit 308 via the switching unit 306. Furthermore, the PWM unit 308 is configured to modulate the voltage command signal ($V_{cmd}$) 342 according to a pulse width modulation scheme to generate a pulse width modulated gate signal 348.

Further, the DC bus compensation unit 310 receives DC voltage signals 350 from the gradient driver unit 104. In one example, the DC voltage signals 350 may be measured by voltage sensors coupled to a capacitor in the gradient driver unit 104. Thereafter, the voltage sensors transmit the measured DC voltage signals to the DC bus compensation unit 310.

The DC bus compensation unit 310 filters noise from the received DC voltage signals 350. Further, the filtered DC voltage signals 352 are provided to the PWM unit 308. Further, the PWM unit 308 modulates each of the filtered DC voltage signals 352 based on the voltage command signal ($V_{cmd}$) 342 received from the voltage adjusting unit 304 to generate PWM gate signals 348. In accordance with one embodiment, a control logic module (not shown in FIG. 3) having pre-programmed instructions/codes may be employed in the PWM unit 308 to generate the pulse width modulated gate signals 348 according to a pulse width modulation scheme.

Moreover, each of the generated pulse width modulated gate signals 348 is then separately applied to each bridge amplifier 106, 108, 110. The pulse width modulated gate signals 348 are used to control an operating frequency or switching frequency of each of the bridge amplifiers 106, 108, 110. When a substantially similar pulse width modulated gate signal 348 is applied to each bridge amplifier, each of the bridge amplifiers 106, 108, 110 operates at a substantially similar frequency at any instant of time. By way of example, initially, if the bridge amplifiers 106, 108, 110 are operating at a higher first switching frequency and the pulse width modulated gate signal 348 having a lower second switching frequency is applied to the gradient driver unit 104, the operating frequency of each of the bridge amplifiers 106, 108, 110 changes from the higher first switching frequency to the lower second switching frequency. Such a change in the switching frequency aids in controlling the second electric current applied to the load unit/gradient coil 112 and facilitates reduction in conduction loss and switching loss in the gradient amplifier system 100. Also, the second electric current is controlled to regulate an excitation voltage applied to the load unit/gradient coil 112 for generating a gradient magnetic field.

In addition to operating the bridge amplifiers 106, 108, 110 at substantially similar switching frequencies, DC voltage sources (not shown in FIG. 3) coupled to the bridge amplifiers 106, 108, 110 are also configured to supply substantially similar DC voltages to the corresponding bridge amplifiers. The supply of substantially similar voltages to the bridge amplifiers 106, 108, 110 results in an even distribution of power loss in the gradient amplifier system 100. Also, since substantially similar bridge amplifiers and DC voltage sources are employed, design and manufacturing constraints are substantially reduced.

As previously noted with reference to FIG. 1, the filter unit 130 is coupled to the output terminal of the gradient driver unit 104 to minimize ripple current associated with the coil current signal 114 supplied by the gradient driver unit 104. After minimizing the ripple current, the filter unit 130 provides the coil current signal 114 to the gradient coil 112.

In some instances, when the coil current signal 114 or the filtered coil current signal 115 is supplied to the gradient coil 112, one or more components in the filter unit 130 and/or the gradient coil 112 may get damaged due to thermal stress. As a result, a faulty condition occurs in the gradient amplifier system 100. In such instances, the diagnostic unit 134 monitors and diagnoses the faulty condition online. If the faulty condition is diagnosed, the diagnostic unit 134 transmits a fault indicator signal 316 to the PWM unit 308 via the switching unit 306. Further, the PWM unit 308 may change the switching frequency of the pulse width modulated gate signals 348 based on the fault indicator signal 316 to reduce the thermal stress on the filter unit 130 and the gradient coil 112. In one example, the PWM unit 308 generates the pulse width modulated gate signals 348 at a lower frequency, e.g., 62.5 kHz, to reduce the excitation voltage or the second electric current supplied from the gradient driver unit 104 to the filter unit 130 and the load unit 112. This in turn minimizes the thermal stress on the filter unit 130 and the gradient coil 112. In one embodiment, the diagnostic unit 134 may be included in the controller unit 102. In another embodiment, the diagnostic unit 134 may be positioned external to the controller unit 102 and operatively coupled to the controller unit 102.

Figure 4:
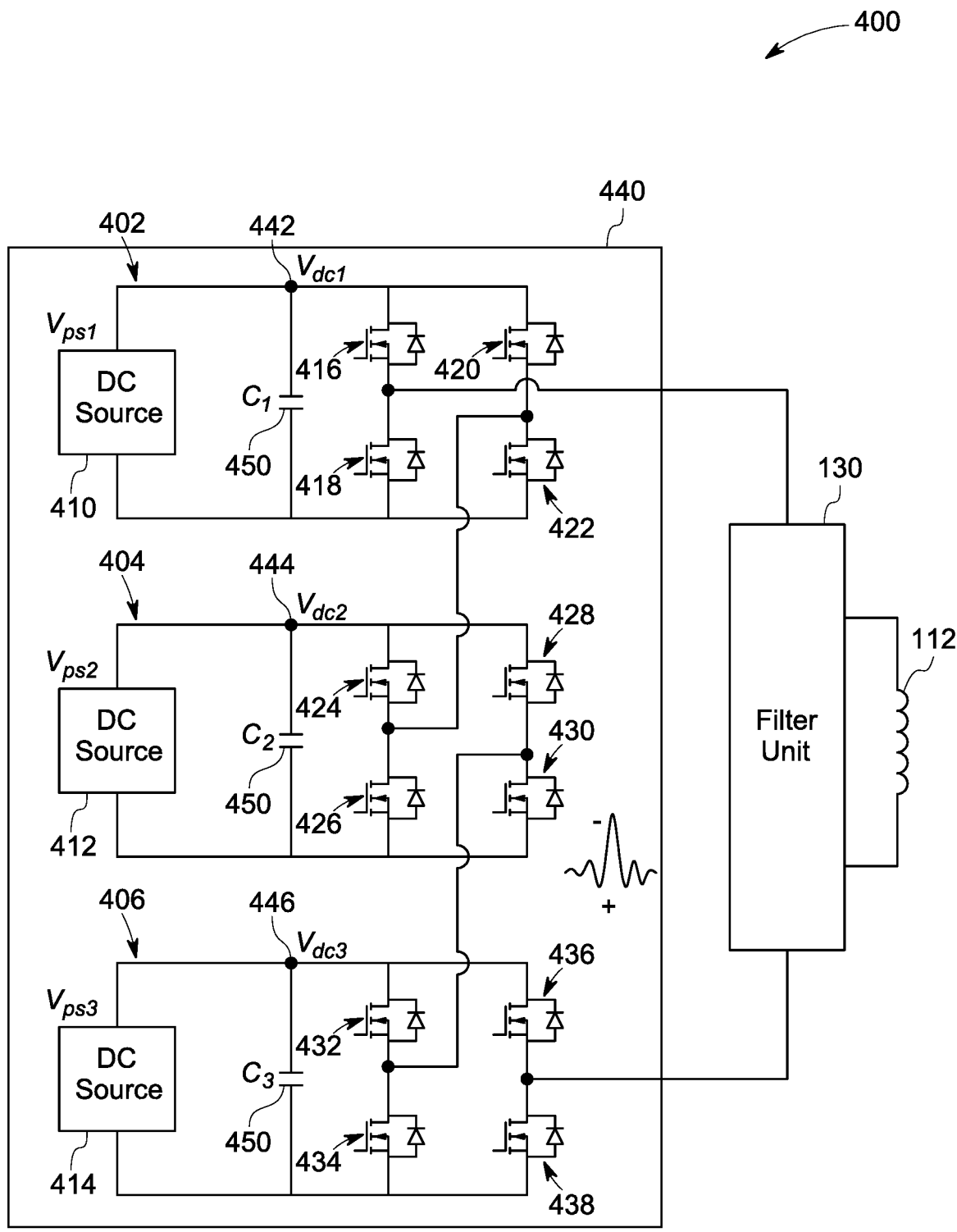
FIG. 4 is a diagrammatical representation of a gradient driver unit for use in the gradient amplifier system of FIGS. 1-3, in accordance with aspects of the present specification.

FIG. 4 is a schematic representation 400 of one embodiment of a gradient driver unit 440, such as the gradient driver unit 104 (see FIG. 1), in accordance with aspects of the present specification. FIG. 4 is described with reference to the components of FIGS. 1-3.

In the illustrated embodiment, the gradient driver unit 440 includes three bridge amplifiers 402, 404, 406 that are coupled in series. The bridge amplifiers 402, 404, 406 are further coupled in series with the gradient coil 112. Moreover, in one embodiment, the bridge amplifiers 402, 404, 406 have substantially similar topologies. Also, design and manufacturing costs of the gradient amplifier system may be significantly reduced without compromising the performance since the bridge amplifiers 402, 404, 406 are configured to use substantially similar transistor modules that operate at substantially similar DC voltages.

A first DC voltage source 410 is coupled across the first bridge amplifier 402, a second DC voltage source 412 is coupled across the second bridge amplifier 404, and a third DC voltage source 414 is coupled across the third bridge amplifier 406. Each of the DC voltage sources 410, 412, 414 is configured to supply a substantially similar DC voltage across the corresponding bridge amplifier 402, 404, 406. By way of example, if it is desirable to supply a DC voltage of about 800 volts, then each of the DC voltage sources 410, 412, 414 supplies a DC voltage of about 800 volts to the corresponding bridge amplifier.

In accordance with further aspects of the present specification, the first bridge amplifier 402 includes transistor modules 416, 418, 420, 422. The transistor modules 416, 418, 420, 422 may be of any suitable type of solid state switching device, such as insulated gate bipolar junction transistors (IGBTs), metal oxide semiconductor field effect transistors (MOSFETs), and the like. The transistor modules 416, 422 are connected in series to form a first leg or left leg of the first bridge amplifier 402. Similarly, transistor modules 418, 420 are connected in series to form a second leg or right leg of the bridge amplifier 402. The first and second legs of the first bridge amplifier 402 are connected in parallel. It may be noted that either one of the legs may be configured to operate as an input terminal while the other leg may be configured to operate as an output terminal of the first bridge amplifier 402. In a similar manner, the second bridge amplifier 404 includes a first leg having transistor modules 424, 430 and a second leg having transistor modules 426, 428. Further, the third bridge amplifier 406 includes a first leg having transistor modules 432, 438 and a second leg having transistor modules 434, 436.

Moreover, the transistor modules in each of the bridge amplifiers 402, 404, 406 are configured to be switched ON or OFF based on the pulse width modulated gate signals provided by the PWM unit 308. By way of example, in the first bridge amplifier 402, the pulse width modulated gate signal is applied to a base terminal of the transistors modules 416, 422 during a time period $T_1$. Particularly, during the time period $T_1$, the left leg transistor modules 416, 422 are energized to an ON state, while the right leg transistor modules 418, 420 remain in an OFF state. Similarly, the pulse width modulated gate signal is applied to a base terminal of the transistors modules 418, 420 during a subsequent time period $T_2$. Thus, during the time period $T_2$, the right leg transistor modules 418, 420 are switched to an ON state, while the left leg transistor modules 416, 422 are switched to an OFF state. Since each leg of the first bridge amplifier 402 switches ON and OFF during a respective time period/duty cycle, the output voltage of the first bridge amplifier 402 is a modulated output voltage signal.

In addition, since each bridge amplifier 402, 404, 406 includes at least two legs and each leg is conducting electric current during a respective time period/duty cycle, the frequency of the modulated output voltage signal at each bridge amplifier is at least twice the frequency of the applied pulse width modulated gate signal. Consequently, the frequency of the total output voltage signal at the output of the gradient driver unit 440 is a product of the frequency of the pulse width modulated gate signal and at least twice the number of bridge amplifiers in the gradient driver unit 440. By way of example, in the embodiment depicted in FIG. 4, the gradient driver unit 440 includes three bridge amplifiers. Accordingly, the frequency of the total output voltage signal at the output of the gradient driver unit 440 is a product of the frequency of pulse width modulated gate signal and twice the number of bridge amplifiers, which in the present example is equal to six.

Moreover, since the bridge amplifiers 402, 404, 406 are connected in series, the total output voltage of the gradient driver unit 440 is a sum of the DC voltages supplied by each of the DC voltage sources 410, 412, 414. By way of example, if it is desirable for each DC voltage source 410, 412, 414 to supply a DC voltage of about 800 volts to the corresponding bridge amplifier, the total output voltage of the gradient driver unit 440 may be from about −2400 volts to about +2400 volts across the gradient driver unit 440.

Furthermore, the gradient driver unit 440 includes voltage sensors 442, 444, 446 that are coupled to a capacitor 450 in each of the bridge amplifiers 402, 404, 406 to measure the DC voltage across the corresponding capacitor 450. Further, the voltage sensors 442, 444, 446 transmit DC voltage signals that are representative of the measured DC voltage to the DC bus compensation unit 310.

Figure 5:
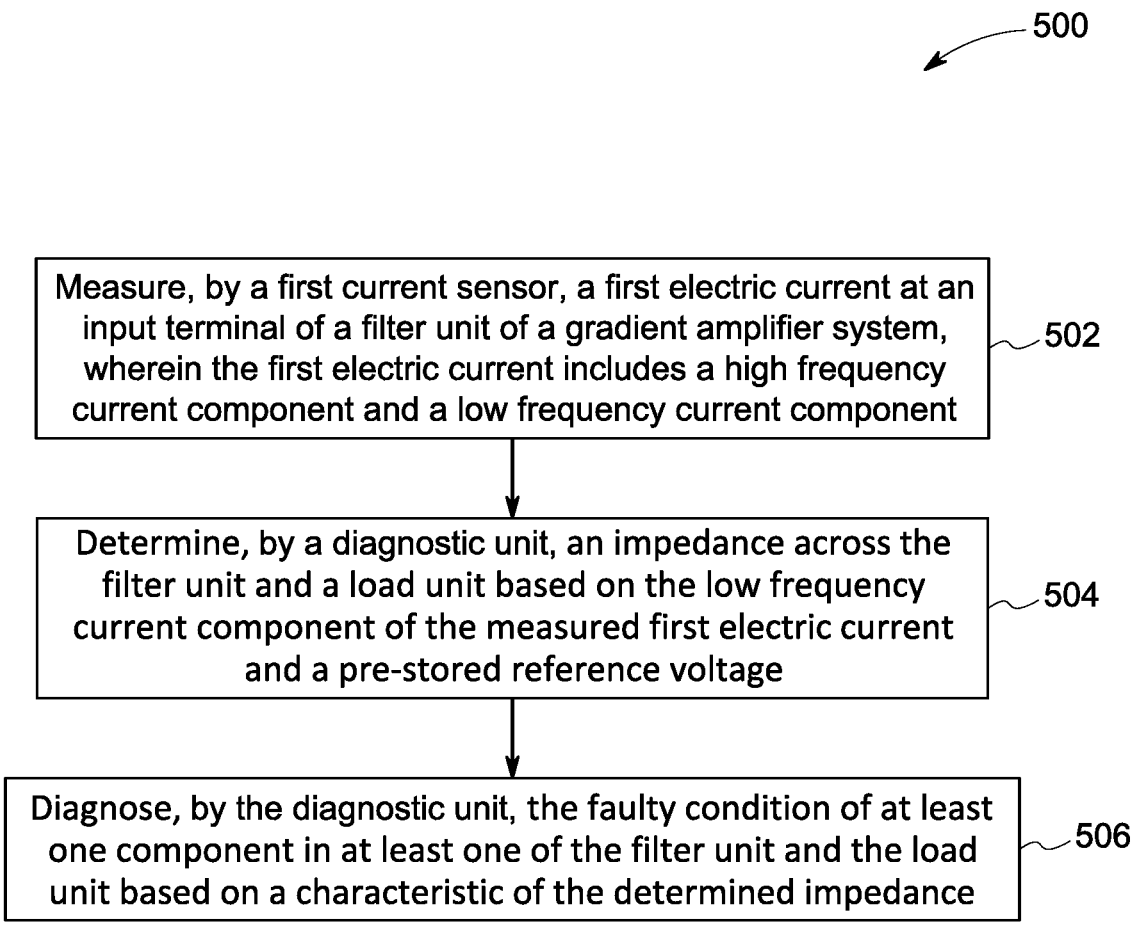
FIG. 5 is a flow chart illustrating a method for diagnosing a faulty condition in the gradient amplifier system, in accordance with aspects of the present specification.

Referring now to FIG. 5, a flow chart 500 illustrating a method for diagnosing a faulty condition of at least one component in at least one of a filter unit and a load unit in the gradient amplifier system 100 of FIG. 1 in accordance with aspects of the present specification, is depicted. At step 502, a first electric current is measured by a first current sensor at an input terminal of the filter unit. Further, when the gradient driver unit is driving the gradient coil to generate a gradient magnetic field, the first current sensor measures or determines the first electric current at the input terminal of the filter unit. The first electric current includes a high frequency current component and a low frequency current component. Further, the first current sensor transmits the measured first electric current to a diagnostic unit.

Subsequently, at step 504, the diagnostic unit determines an impedance across the filter unit and the load unit based on the low frequency current component of the measured first electric current and a pre-stored reference voltage. In particular, the diagnostic unit receives a first current signal corresponding to the measured first electric current from the first current sensor. Further, the diagnostic unit performs a Fast Fourier Transform (FFT) operation to transform the first current signal representative of the first electric current to a frequency domain to separate the low frequency current component from the high frequency current component of the first electric current. Thereafter, the diagnostic unit extracts the low frequency current component of the first electric current. Further, the diagnostic unit computes the impedance across the filter unit and the load unit based on the low frequency current component and the pre-stored reference voltage. As previously noted, the pre-stored reference voltage may be received from the external source and stored within the diagnostic unit. In one embodiment, the diagnostic unit determines the impedance across the filter unit and the load unit based on a ratio of the reference voltage and the low frequency current component of the first electric current.

In addition, at step 506, the diagnostic unit diagnoses a faulty condition of at least one component in at least one of the filter unit and the load unit based on a characteristic of the determined impedance. In particular, the diagnostic unit compares the characteristic of the determined impedance with a predefined impedance characteristic to estimate a change in the impedance across the filter unit and the load unit. Further, the diagnostic unit diagnoses the faulty condition of the at least one component in the at least one of the filter unit and the load unit based on the comparison. In one example, the diagnostic unit diagnoses the faulty condition of the at least one component in at least one of the filter unit and the load unit if the change in the impedance is greater than a reference impedance value. Thereafter, the diagnostic unit may communicate/transmit the faulty condition to the operator.

FIG. 9 is a block diagram illustrating a magnetic resonance imaging (MRI) system 1400 that includes the exemplary gradient amplifier system 100 (see FIG. 1), in accordance with aspects of the present specification. The MRI system 1400 includes a scanner 1402, scanner control circuitry 1404, and system control circuitry 1406. In the illustrated embodiment, the scanner 1402 is a full body scanner having a patient bore 1408 into which a table 1410 is positioned to place a patient 1412 or any suitable object in a desired position for scanning. The scanner 1402 may be of any suitable type of rating, for example, varying from 0.5 Tesla rating to 3 Tesla rating or beyond 3 Tesla rating.

Additionally, the scanner 1402 includes a series of associated coils for producing controlled magnetic fields, for generating radio-frequency (RF) excitation pulses, and for detecting emissions from gyromagnetic material within the patient 1412 in response to RF excitation pulses. In the illustrated embodiment, associated coils include a primary magnet coil 1414 provided for generating a primary magnetic field generally aligned with the patient bore 1408. Further, a series of gradient coils 1416, 1418, 1420 form a coil assembly for generating controlled gradient magnetic fields during examination sequences. Additionally, a radio frequency (RF) coil 1422 is provided for generating radio frequency pulses for exciting the gyromagnetic material. In the embodiment illustrated in FIG. 9, the RF coil 1422 is coupled with driving and receiving circuitry in passive and active modes for receiving emissions from the gyromagnetic material and for applying RF excitation pulses to the gyromagnetic material.

In a presently contemplated configuration, the gradient coils 1416, 1418, 1420 may have different physical configurations adapted to corresponding functions in the MRI system 1400. The gradient coils 1416, 1418, 1420 include conductive wires, bars or plates that are wound or cut to form a coil structure that generates a gradient field upon application of control pulses. The placement of the gradient coils 1416, 1418, 1420 may vary depending on the application. In one embodiment, a Z-axis coil may be positioned at an innermost location of the scanner 1402 and may be formed generally as a solenoid-like structure that has a relatively lower impact on the RF magnetic field. In the illustrated embodiment, the gradient coil 1420 is the Z-axis solenoid coil, while the coils 1416 and 1418 are Y-axis and X-axis coils respectively.

Furthermore, the gradient coils 1416, 1418, 1420 may be configured to facilitate generation of precisely controlled magnetic fields, strengths of which vary along a predefined field of view. When each coil is energized with an electric current, the resulting magnetic field gradient is superimposed over the primary field and produces a desirably linear variation in the Z-axis component of the magnetic field strength across the field of view. The field varies linearly in one direction, but is homogenous in the other two. The three coils 1416, 1418, 1420 have mutually orthogonal axes for the direction of their variation, enabling a linear field gradient to be imposed in an arbitrary direction with an appropriate combination of the three gradient coils 1416, 1418, 1420.

The coils 1414, 1416, 1418, 1420, 1422 of the scanner 1402 are controlled by the scanner control circuitry 1404 to generate the desired magnetic field and the RF pulses. The scanner control circuitry 1404 is configured to acquire image data corresponding to the patient 1412. Also, the scanner control circuitry 1404 includes a control circuit 1426 for commanding the pulse sequences employed during the examinations and for processing received signals. The control circuit 1426 may include any suitable programmable logic device, such as a central processing unit (CPU) or a digital signal processor of a general purpose or an application-specific computer. Also, the control circuit 1426 is communicatively coupled to memory circuitry 1428 such as volatile and non-volatile memory devices for storing physical and logical axis configuration parameters, examination pulse sequence descriptions, acquired image data, programming routines, and so forth, used during the examination sequences implemented by the scanner 1402.

Interface between the control circuit 1426 and the coils 1414, 1416, 1418, 1420, 1422 of the scanner 1402 is managed by amplification and control circuitry 1430 and by transmission and receive (T/R) interface circuitry 1432. The amplification and control circuitry 1430 includes amplifiers for each gradient coil 1414, 1416, 1418, 1420 to supply drive current in response to control signals generated from the control circuit 1426. In certain embodiments, the MRI system 1400 may include the gradient amplifier system 100 of FIG. 1. The gradient amplifier system 100 is operationally coupled to the scanner control circuitry 1404, in one embodiment. However, in certain other embodiments, the scanner control circuitry 1404 may include the gradient amplifier system 100.

The gradient amplifier system 100 is used to drive high current and high voltage to the gradient coils 1416, 1418, 1420 to generate appropriate/suitable gradient magnetic fields within a short period of time. The gradient coils 1416, 1418, 1420 are configured to produce/generate the gradient magnetic fields for localizing the imaging data. In some instances, the gradient amplifier system 100 may impose thermal stress on the gradient coils 1416, 1418, 1420 and components in a filter unit (not shown). As a result, the gradient coils 1416, 1418, 1420 and/or components in the filter unit may fail or be partially damaged over time. The exemplary gradient amplifier system 100 includes a diagnostic device (not shown) to detect such a faulty condition. The diagnostic device may monitor the gradient amplifier system 100 during operation to diagnose the faulty condition. Monitoring the gradient amplifier system 100 during operation is useful because the diagnostic device may diagnose the faulty condition even when the gradient amplifier system 100 is actively functioning to drive the gradient coils 1416, 1418, 1420 to generate the gradient magnetic field.

The T/R interface circuitry 1432 includes additional amplification circuitry for driving the RF coil 1422. Moreover, where the RF coil 1422 serves both to emit the RF excitation pulses and to receive MR signals, the T/R interface circuitry 1432 may typically include a switching device for toggling the RF coil 1422 between an active or transmitting mode and a passive or receiving mode. A power supply source, denoted generally by reference numeral 1424 is provided for energizing the primary magnet coil 1414. The scanner control circuitry 1404 includes interface components 1434 for exchanging configuration and image data with the system control circuitry 1406. It may be noted that while in the present description reference is made to a horizontal cylindrical bore imaging system employing a superconducting primary field magnet assembly, the gradient amplifier system may also be applied to various other configurations, such as scanners employing vertical fields generated by superconducting magnets, permanent magnets, electromagnets, or combinations thereof.

The system control circuitry 1406 may include a wide range of devices for facilitating interface between an operator or a radiologist and the scanner 1402 via the scanner control circuitry 1404. In the illustrated embodiment, for example, the system control circuitry includes an operator controller 1436 which is a computer workstation employing a general purpose or application-specific computer. The operator controller 1436 also typically includes memory circuitry for storing examination pulse sequence descriptions, examination protocols, user and patient data, image data, both raw and processed, and so forth. Further, the operator controller 1436 may further include various interface and peripheral drivers for receiving and exchanging data with local and remote devices. In the illustrated embodiment, the operator controller 1436 includes a computer keyboard 1438 and an alternative input device such as a mouse 1440. A printer 1442 may be provided for generating hard copy output of documents and images reconstructed from the acquired data. Moreover, a computer monitor 1444 may be provided for facilitating interface with an operator. In addition, the system 1400 may include various local and remote image access and examination control devices, represented generally by reference numeral 1452. Such devices may include picture archiving and communication systems (PACS), teleradiology systems, and the like.

The method and systems described hereinabove aid in fast diagnosis of the faulty condition in the gradient amplifier system. Also, parameters of the gradient amplifier system may be monitored and online diagnosis of the faulty condition in the gradient amplifier system may be performed.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A diagnostic device, comprising:
   a first current sensor configured to be electrically coupled to an input terminal of a filter unit of a gradient amplifier system, wherein the first current sensor is configured to measure a first electric current at the input terminal of the filter unit, and wherein the first electric current comprises a high frequency current component and a low frequency current component;
   a diagnostic unit electrically coupled to the first current sensor, wherein the diagnostic unit is configured to:
      determine an impedance across the filter unit and a load unit based on the low frequency current component of the measured first electric current and a pre-stored reference voltage; and
      diagnose a faulty condition of at least one component in at least one of the filter unit and the load unit based on a characteristic of the determined impedance.

2. The diagnostic device of claim 1, wherein the diagnostic unit is further configured to:
   receive a first current signal corresponding to the measured first electric current from the first current sensor; and
   perform a fast Fourier transform (FFT) to extract the low frequency current component from the received first current signal.

3. The diagnostic device of claim 2, wherein the diagnostic unit is further configured to:
   compare the characteristic of the determined impedance with a predefined impedance characteristic to determine a change in the impedance across the filter unit and the load unit;
   diagnose the faulty condition of the at least one component in at least one of the filter unit and the load unit based on the comparison of the characteristic of the determined impedance with the predefined impedance characteristic; and
   transmit a fault indicator signal based on the diagnosed faulty condition.

4. The diagnostic device of claim 3, wherein the diagnostic unit is configured to determine the impedance across a range of frequencies associated with the low frequency current component, and wherein the determined impedance comprises at least a first impedance across a first sub-range of frequencies of the range of the frequencies and a second impedance across a second sub-range of frequencies of the range of the frequencies.

5. The diagnostic device of claim 4, wherein the diagnostic unit is configured to:
   compare the first impedance across the first sub-range of frequencies with a first predefined impedance corresponding to the first sub-range of frequencies; and
   diagnose the faulty condition of the at least one component in at least one of the filter unit and the load unit based on the comparison of the first impedance across the first sub-range of frequencies with the first predefined impedance.

6. The diagnostic device of claim 5, wherein the diagnostic unit is further configured to:
   compare the second impedance across the second sub-range of frequencies with a second predefined impedance corresponding to the second sub-range of frequencies; and
   diagnose the faulty condition of the at least one component in at least one of the filter unit and the load unit based on the comparison of the second impedance across the second sub-range of frequencies with the second predefined impedance.

7. The diagnostic device of claim 3, further comprising a second current sensor configured to be electrically coupled to an input terminal of the load unit, wherein the second current sensor is configured to determine a second electric current at the input terminal of the load unit.

8. The diagnostic device of claim 7, wherein the second current sensor is coupled to a controller unit of the gradient amplifier system and configured to transmit a second current signal representative of the second electric current to the controller unit.

9. The diagnostic device of claim 8, wherein the diagnostic unit is configured to transmit the fault indicator signal to the controller unit to reduce the second electric current to minimize thermal stress on at least one of the filter unit and the load unit if the faulty condition is diagnosed.

10. A gradient amplifier system, comprising:
   a gradient driver unit configured to generate a coil current signal;
   a filter unit electrically coupled to the gradient driver unit and configured to filter ripples in the coil current signal to generate a filtered coil current signal;
   a load unit electrically coupled to the filter unit and configured to:
      receive the filtered coil current signal;
      generate a gradient magnetic field;
   a diagnostic device comprising:
      a first current sensor electrically coupled to an input terminal of the filter unit, wherein the first current sensor is configured to measure a first electric current at the input terminal of the filter unit, and wherein the first electric current comprises a high frequency current component and a low frequency current component;

a diagnostic unit electrically coupled to the first current sensor, wherein the diagnostic unit is configured to:
determine an impedance across the filter unit and the load unit based on the low frequency current component of the measured first electric current and a pre-stored reference voltage; and
diagnose a faulty condition of at least one component in at least one of the filter unit and the load unit based on a characteristic of the determined impedance.

11. The gradient amplifier system of claim 10, wherein the diagnostic device further comprises a second current sensor configured to be electrically coupled to an input terminal of the load unit, and wherein the second current sensor is configured to determine a second electric current at the input terminal of the load unit.

12. The gradient amplifier system of claim 11, further comprising a controller unit coupled to the second current sensor, wherein the controller unit is configured to:
receive a second current signal representative of the second electric current; and
generate a voltage command signal based on the second current signal and a reference current signal.

13. The gradient amplifier system of claim 12, wherein the controller unit comprises a pulse width modulator unit configured to:
receive one of the voltage command signal from the controller unit and a fault indicator signal from the diagnostic unit, wherein the fault indicator signal is representative of the faulty condition;
generate a pulse width modulated gate signal based on one of the voltage command signal and the fault indicator signal; and
transmit the pulse width modulated gate signal to the gradient driver unit to control the second electric current applied to the input terminal of the load unit.

14. The gradient amplifier system of claim 13, wherein the controller unit is configured to control the second electric current to regulate an excitation voltage applied to the load unit for generating the gradient magnetic field.

15. A magnetic resonance imaging system comprising:
scanner control circuitry configured to acquire image data, wherein the scanner control circuitry comprises:
a gradient amplifier system comprising:
a gradient driver unit configured to generate a coil current signal;
a filter unit electrically coupled to the gradient driver unit and configured to filter ripples in the coil current signal to generate a filtered coil current signal;
a load unit electrically coupled to the filter unit and configured to generate a gradient magnetic field based on the filtered coil current signal;
a diagnostic device comprising:
a first current sensor electrically coupled to an input terminal of the filter unit, wherein the first current sensor is configured to measure a first electric current at the input terminal of the filter unit, and wherein the first electric current comprises a high frequency current component and a low frequency current component;
a diagnostic unit electrically coupled to the first current sensor, wherein the diagnostic unit is configured to:
determine an impedance across the filter unit and the load unit based on the low frequency current component of the measured first electric current and a pre-stored reference voltage;
diagnose a faulty condition of at least one component in at least one of the filter unit and the load unit based on a characteristic of the determined impedance; and
system control circuitry communicatively coupled to the scanner control circuitry and configured to process the acquired image data.

16. The magnetic resonance imaging system of claim 15, wherein the diagnostic unit is further configured to:
receive a first current signal corresponding to the measured first electric current from the first current sensor; and
perform a fast Fourier transform (FFT) to extract the low frequency current component from the received first current signal.

17. The magnetic resonance imaging system of claim 16, wherein the diagnostic unit is further configured to:
compare the characteristic of the determined impedance with a predefined impedance characteristic to determine a change in the impedance across the filter unit and the load unit;
diagnose the faulty condition of the at least one component in at least one of the filter unit and the load unit based on the comparison of the characteristic of the determined impedance with the predefined impedance characteristic; and
transmit a fault indicator signal based on the diagnosed faulty condition.

18. The magnetic resonance imaging system of claim 17, wherein the diagnostic unit is configured to determine the impedance across a range of frequencies associated with the low frequency current component, and wherein the determined impedance comprises at least a first impedance across a first sub-range of frequencies of the range of the frequencies and a second impedance across a second sub-range of frequencies of the range of the frequencies.

19. The magnetic resonance imaging system of claim 18, wherein the diagnostic unit is configured to:
compare the first impedance across the first sub-range of frequencies with a first predefined impedance corresponding to the first sub-range of frequencies; and
diagnose the faulty condition of the at least one component in at least one of the filter unit and the load unit based on the comparison of the first impedance across the first sub-range of frequencies with the first predefined impedance.

20. The magnetic resonance imaging system of claim 19, wherein the diagnostic unit is further configured to:
compare the second impedance across the second sub-range of frequencies with a second predefined impedance corresponding to the second sub-range of frequencies; and
diagnose the faulty condition of the at least one component in at least one of the filter unit and the load unit based on the comparison of the second impedance across the second sub-range of frequencies with the second predefined impedance.

* * * * *